United States Patent
Sultenfuss et al.

(10) Patent No.: US 8,174,993 B2
(45) Date of Patent: May 8, 2012

(54) SYSTEM, METHOD AND DEVICE FOR TUNING A SWITCHED TRANSMISSION LINE FOR ETHERNET LOCAL AREA NETWORK-ON-MOTHERBOARD (LOM)

(75) Inventors: Andrew T. Sultenfuss, Leander, TX (US); Jonathan Foster Lewis, Pflugerville, TX (US)

(73) Assignee: Dell Products L.P., Round Rock, TX (US)

( * ) Notice: Subject to any disclaimer, the term of this patent is extended or adjusted under 35 U.S.C. 154(b) by 2660 days.

(21) Appl. No.: 10/679,130

(22) Filed: Oct. 3, 2003

(65) Prior Publication Data

US 2005/0097218 A1    May 5, 2005

(51) Int. Cl.
*H04L 12/26* (2006.01)
(52) U.S. Cl. ........ 370/252; 370/241; 370/244; 370/465; 379/15.01; 379/342; 379/344
(58) Field of Classification Search .................. 370/252, 370/449, 282, 247, 463, 293, 395.5, 395.2, 370/445, 419, 465, 431; 709/208, 250, 223, 709/243, 238; 700/297, 286, 295, 291; 713/300, 713/330, 324, 340
See application file for complete search history.

(56) References Cited

U.S. PATENT DOCUMENTS

| | | | | |
|---|---|---|---|---|
| 4,972,457 A | | 11/1990 | O'Sullivan | 379/59 |
| 5,878,030 A | * | 3/1999 | Norris | 370/241 |
| 6,226,292 B1 | * | 5/2001 | DiPlacido | 370/395.7 |
| 6,298,046 B1 | * | 10/2001 | Thiele | 370/282 |
| 6,393,109 B1 | * | 5/2002 | Willer | 379/90.01 |
| RE38,127 E | | 5/2003 | O'Sullivan | 455/557 |
| 6,920,185 B2 | * | 7/2005 | Hinson | 375/295 |
| 7,058,172 B2 | * | 6/2006 | Jiang et al. | 379/387.01 |
| 7,787,386 B1 | * | 8/2010 | Marshall et al. | 370/244 |
| 2003/0021349 A1 | | 1/2003 | Jiang et al. | 375/257 |
| 2003/0224801 A1 | * | 12/2003 | Lovberg et al. | 455/454 |

* cited by examiner

*Primary Examiner* — Michael J Moore, Jr.
(74) *Attorney, Agent, or Firm* — Baker Botts L.L.P.

(57) ABSTRACT

A method, system and device are disclosed for compensating or tuning one or more communication pathways between an external network and an information handling system. In one aspect, one or more inductive devices may be coupled to one or more transmission lines coupling a physical layer transceiver (PHY) to one of a plurality of external network communication ports via a board-mounted communication switch. Selection and placement, such as serial placement, of the one or more inductive devices depends, at least in part, upon one or more electrical characteristics of the transmission lines, the PHY, the communication switch and requirements of the external network.

17 Claims, 3 Drawing Sheets

SYSTEM, METHOD AND DEVICE FOR TUNING A SWITCHED TRANSMISSION LINE FOR ETHERNET LOCAL AREA NETWORK-ON-MOTHERBOARD (LOM)

TECHNICAL FIELD

The present disclosure relates generally to information handling systems and, more particularly, to communications connectivity in portable information handling systems.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As an important standards organization, IEEE (Institute of Electrical & Electronics Engineers) organizes groups of industry members to pursue development of various information handling system technologies. Standardization of a technology by IEEE typically results in guidelines by which manufacturers, programmers, and other entities involved with device production must comply in order to make their products compatible, interoperable, or otherwise cooperative. Acting in its standards producing capacity, IEEE has established a myriad of guidelines for implementing Gigabit Ethernet (IEEE 802.3ab).

Portable information handling systems are commonly employed as desktop replacements with the use of port replicators or docking stations. Current port replicating and docking station technology typically replaces one or more of the external ports of the portable system with a respective port on the port replicator or docking station. While port replication has generally simplified connectivity and enhanced portability of portable information handling systems, these advances have given rise to other issues.

As mentioned above, IEEE has defined various boundaries to which a Gigabit Ethernet or IEEE 802.3ab compliant device or program must conform. In many conventional portable information handling systems, addition of a multiplexer (or mux) to switch communications, such as Ethernet network communications, from one port to another port typically disturbs one or more electrical characteristics of the communication transmission lines and often results in transmission line return loss failures. In addition, use of an Ethernet switching device for port control may also introduce parasitic capacitance and prevent devices from complying with relevant IEEE specifications.

A number of conventional portable information handling system, port replicator and docking station designs generally ignore transmission line return loss failures as well as other aspects of non-compliance and instead rely on Bit Error Rate to achieve some measure of communication reliability. Consequently, many of these designs violate IEEE 802.3ab specifications and are, therefore, not IEEE compliant. While non-compliance may be a design failure that casual users of portable information handling systems can overcome, enterprise or power users typically demand the reliability and integrity of full IEEE compliance in their information handling system wares.

SUMMARY

In accordance with teachings of the present disclosure, an information handling system including a processor, at least one memory, and a physical layer transceiver operably associated with the memory and the processor is provided. The information handling system preferably also includes a communication switch operably coupled to the physical layer transceiver via a first set of board-mounted transmission lines, a communication port operably coupled to the communication switch via a second set of board-mounted transmission lines, and a port replicator connector operably coupled to the communication switch via a third set of board-mounted transmission lines. The communication port is preferably operable to communicatively couple to an external network connection and the port replicator connector is preferably operable to communicatively couple the information handling system to an external network connection via a port replicator mounted communication port. The information handling system of the present disclosure preferably also includes a plurality of inductive devices operably coupled to a plurality of the transmission lines. The inductive devices are preferably selected and coupled to the transmission lines such that one or more electrical characteristics of selected transmission lines may be tuned to substantially approximate one or more electrical characteristics required by an external network.

Also in accordance with teachings of the present disclosure, a circuit board for use in an information handling system is provided. The circuit board preferably includes at least one Ethernet physical layer transceiver and at least one Ethernet switch communicatively coupled to the Ethernet physical layer transceiver through a first plurality of transmission lines. In addition, at least one Ethernet communication port and a port replicating device connector are communicatively coupled to the Ethernet switch through a second plurality of transmission lines and a third plurality of transmission lines, respectively. The circuit board preferably also includes a plurality of inductive devices serially coupled to a plurality of the transmission lines, the inductive devices selected and positioned such that an impedance measure from the Ethernet physical layer transceiver to an external Ethernet network connection on the circuit board substantially matches an impedance measure required by a communication protocol on an Ethernet network.

In a further embodiment, and in accordance with teachings of the present disclosure, a method for creating a compliant board-mounted gigabit Ethernet communication pathway is provided. The board-mounted gigabit Ethernet communication pathway preferably includes a gigabit Ethernet switch coupled to a gigabit Ethernet physical layer transceiver, an Ethernet communication port and a port replicator connector through a first, second and third plurality of transmission lines, respectively. The method preferably includes measuring capacitive effects on the communication pathway resulting from addition of the gigabit Ethernet switch. The method preferably also includes selecting an inductive device determined capable of reducing the additional capacitive effect of the gigabit Ethernet switch and coupling the inductive device to a plurality of the transmission lines coupled to the gigabit Ethernet switch.

In yet another embodiment, and in accordance with teachings of the present disclosure, a communication pathway including a physical layer transceiver, an electronic switch, a communication port and a port replicator connection is provided. According to teachings of the present disclosure, the electronic switch is preferably coupled to the physical layer transceiver through four pairs of transmission lines. The communication port is preferably coupled to the electronic switch through four pairs of transmission lines and the port replicator connection is preferably coupled to the electronic switch through four pairs of transmission lines. The electronic switch, in one embodiment, is preferably operable to selectively activate communications capabilities on the communication port and the port replicator connection. At least one of the four pairs of transmission lines, in one embodiment, preferably includes, on each transmission line, an inductive device serially coupled thereto. Selection and placement of the inductive devices is preferably determined in a accordance with achieving substantial impedance matching with a communication network to be connected to the information handling system.

In one aspect, the present disclosure teaches a portable information handling system capable of switching between communication ports while maintaining compliance with IEEE standards for Gigabit Ethernet.

In another aspect, the present disclosure teaches a communications pathway, switched between an on-board communication port and a port replicator or docking station provided network connection, having transmission line characteristics substantially matching that of preferred network media and protocols.

In a further aspect, the present disclosure teaches a manner in which to improve the reliability and integrity of a communication interface between a docking station and a portable information handling system.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
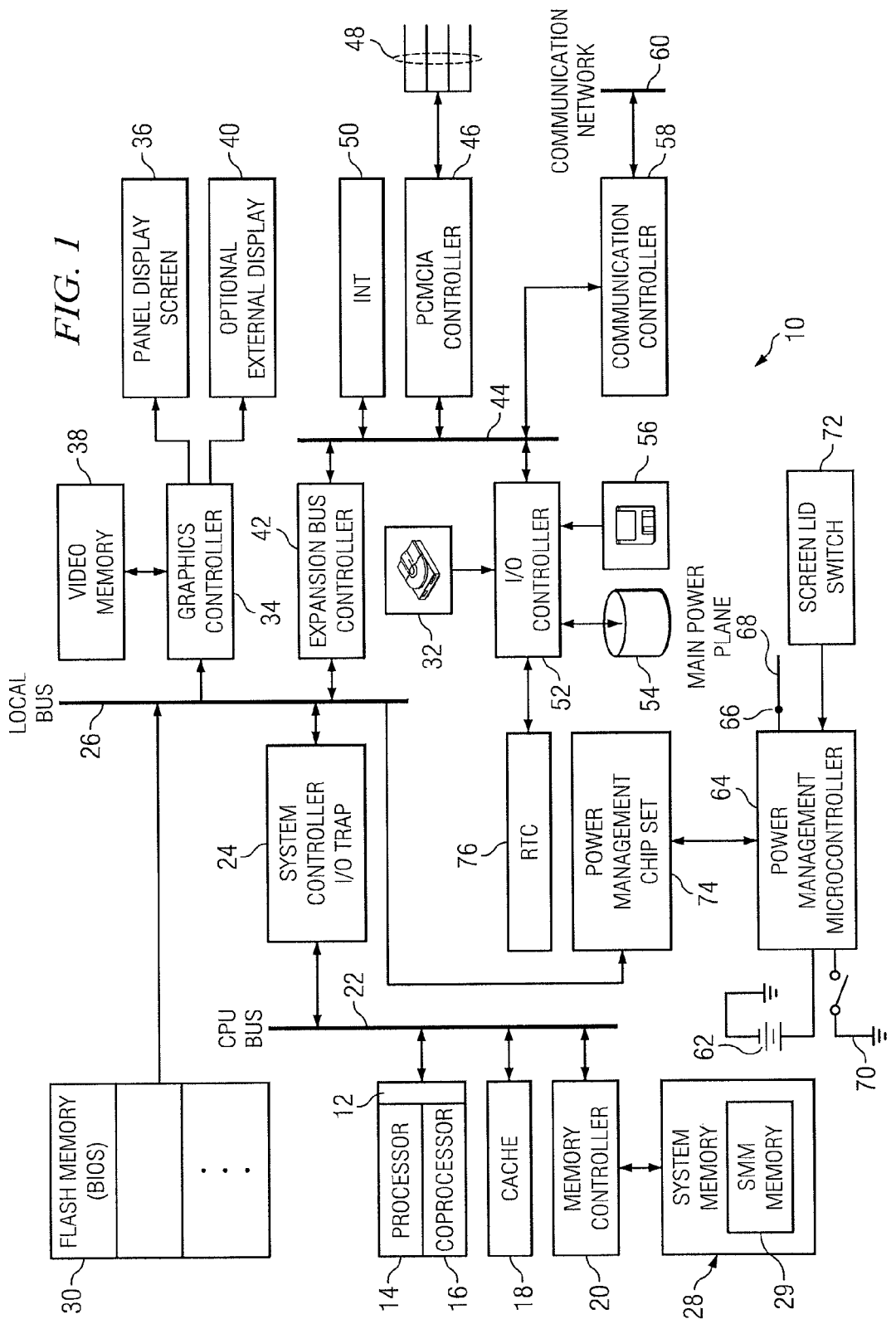
FIG. 1 is a block diagram depicting an embodiment of a portable information handling system according to teachings of the present disclosure.
Figure 2:
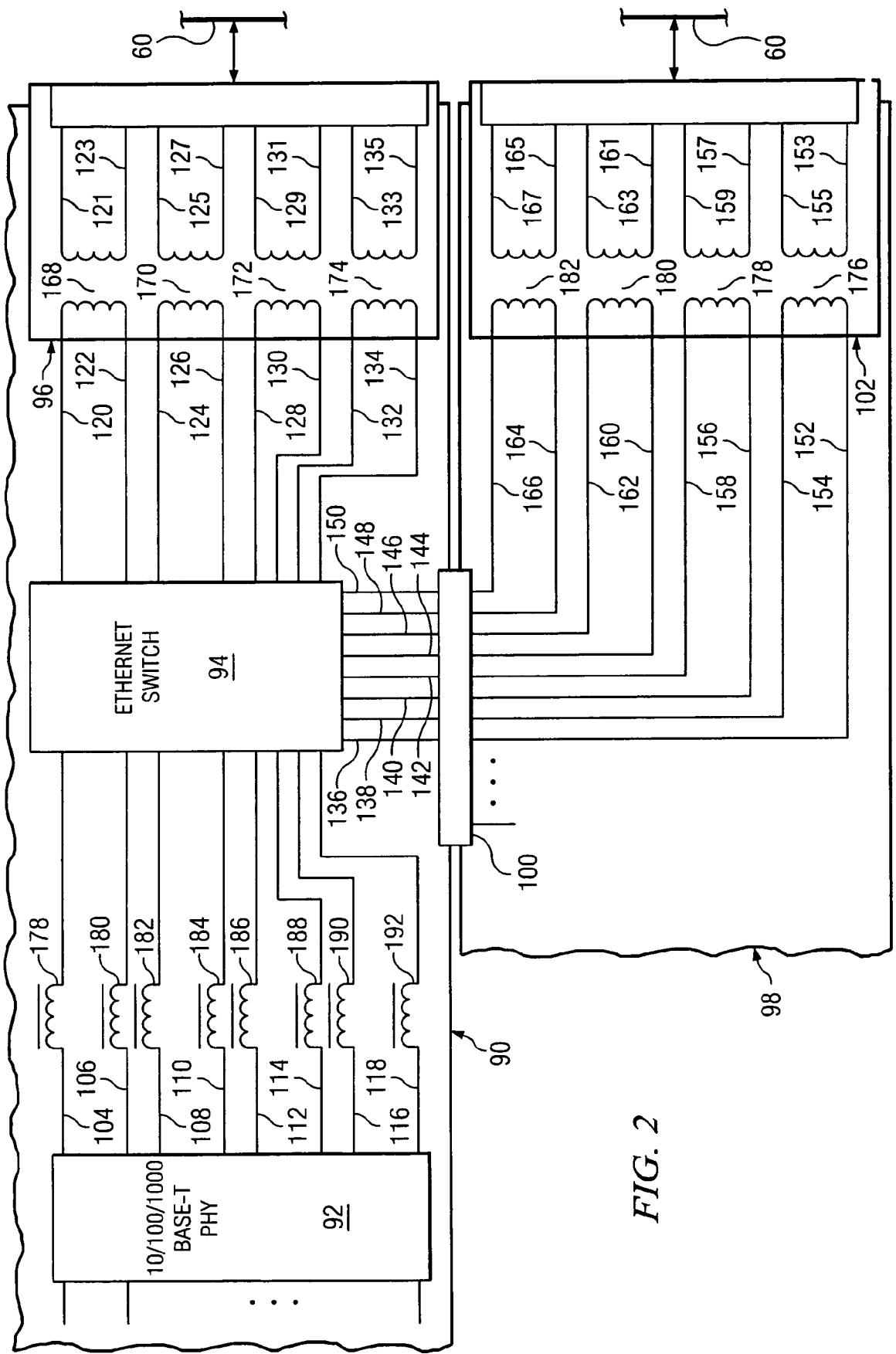
FIG. 2 illustrates a partial view of one embodiment of a circuit board and a partial view of port replicator connection operable in an information handling system having switched communication ports according to teachings of the present disclosure.
Figure 3:
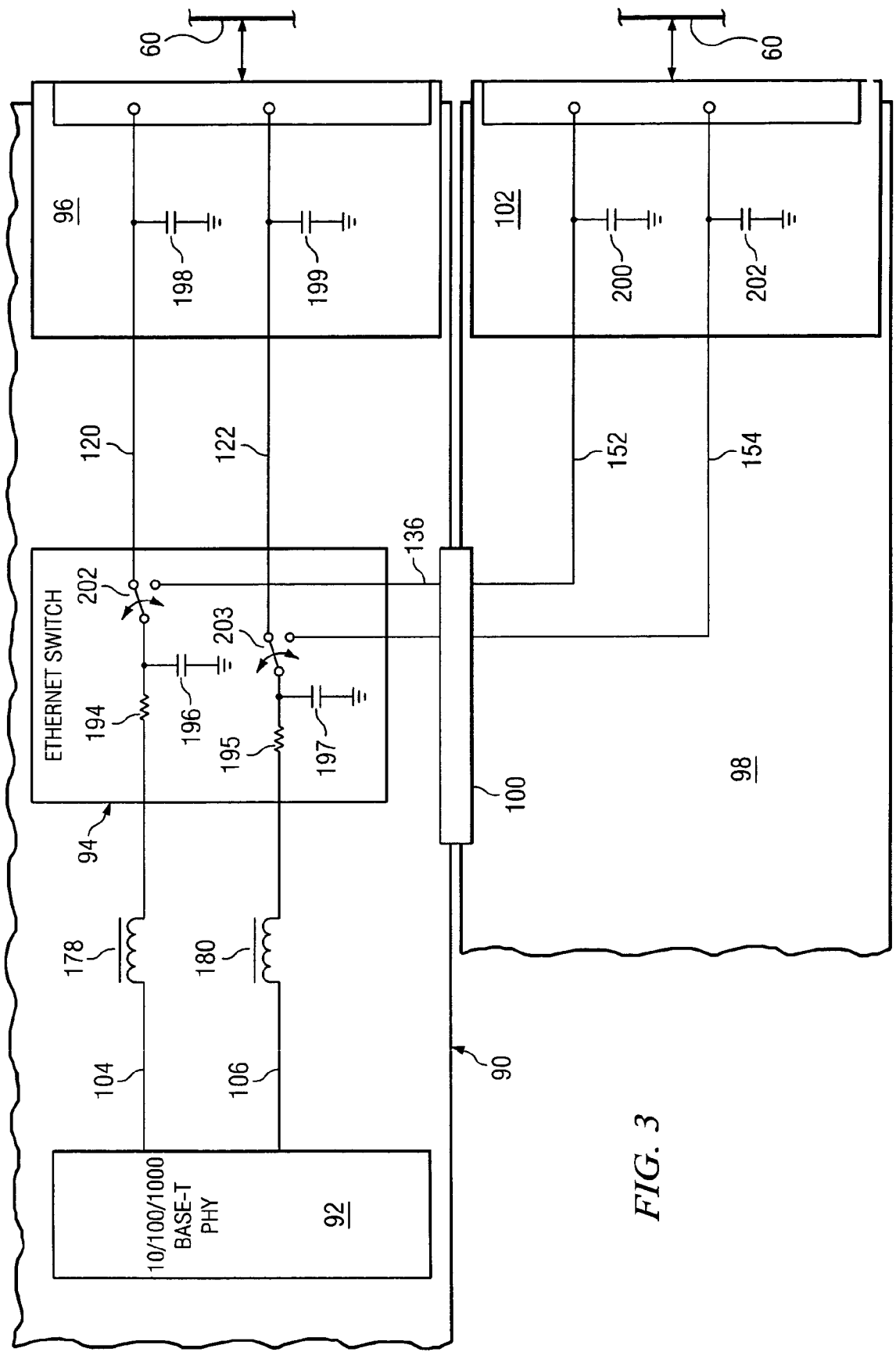
FIG. 3 is a block diagram illustrating selected electrical characteristics of one embodiment of a compensated switched transmission line according to teachings of the present disclosure.

Preferred embodiments and their advantages are best understood by reference to FIGS. 1 through 3, wherein like numbers are used to indicate like and corresponding parts.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Referring first to FIG. 1, a block diagram of an information handling system is shown, according to teachings of the present invention. Information handling system or computer system 10 preferably includes at least one microprocessor or central processing unit (CPU) 12. CPU 12 may include processor 14 for handling integer operations and coprocessor 16 for handling floating point operations. CPU 12 is preferably coupled to cache 18 and memory controller 20 via CPU bus 22. System controller I/O trap 24 preferably couples CPU bus 22 to local bus 26 and may be generally characterized as part of a system controller.

Main memory 28 of dynamic random access memory (DRAM) modules is preferably coupled to CPU bus 22 by a memory controller 20. Main memory 28 may be divided into one or more areas such as system management mode (SMM) memory area 29.

Basic input/output system (BIOS) memory 30 is also preferably coupled to local bus 26. FLASH memory or other nonvolatile memory may be used as BIOS memory 30. A BIOS program (not expressly shown) is typically stored in BIOS memory 30. The BIOS program preferably includes software which facilitates interaction with and between information handling system 10 and devices such as a keyboard (not expressly shown), a mouse (not expressly shown), or CD-ROM 32. BIOS memory 30 may also store system code operable to control a plurality of basic information handling system 10 operations.

Graphics controller 34 is preferably coupled to local bus 26 and to panel display screen 36. Graphics controller 34 may also be coupled to video memory 38 operable to store information to be displayed on panel display 36. Panel display 36 is typically an active matrix or passive matrix liquid crystal display (LCD), however, other display technologies may be employed. In selected applications, uses or instances, graphics controller 34 may also be coupled to an optional, external display or standalone monitor display 40.

Bus interface controller or expansion bus controller 42 preferably couples local bus 26 to expansion bus 44. In one embodiment, expansion bus 44 may be configured as an Industry Standard Architecture ("ISA") bus. Other buses, for example, a Peripheral Component Interconnect ("PCI") bus, may also be used.

Personal computer memory card international association (PCMCIA) controller 46 may also be coupled to expansion bus 44 as shown. PCMCIA controller 46 is preferably coupled to a plurality of expansion slots 48. Expansion slots 48 may be configured to receive one or more PCMCIA expansion cards such as modems, fax cards, communications cards, and other input/output (I/O) devices.

Interrupt request generator 50 is also preferably coupled to expansion bus 44. Interrupt request generator 50 is preferably operable to issue an interrupt service request over a predetermined interrupt request line in response to receipt of a request to issue interrupt instruction from CPU 12.

I/O controller 52, often referred to as a super I/O controller, is also preferably coupled to expansion bus 44. I/O controller 52 preferably interfaces to integrated drive electronics (IDE) hard drive 54, CD-ROM (compact disk-read only memory) drive 32 and floppy disk drive 56. Other disk drive devices (not expressly shown) which may be interfaced to the I/O controller include a removable hard drive, a zip drive, a CD-RW (compact disk-read/write) drive, and a CD-DVD (compact disk-digital versatile disk) drive.

Communication controller 58 is preferably provided and enables information handling system 10 to communicate with communication network 60, e.g., an Ethernet network. Communication network 60 may include a local area network (LAN), wide area network (WAN), Internet, Intranet, wireless broadband or the like. Communication controller 58 may be employed to form a network interface for communicating with other information handling systems (not expressly shown) coupled to communication network 60. Communicative aspects of information handling system 10 will be discussed in greater detail below.

As illustrated, information handling system 10 preferably includes power supply 62, which provides power to the many components and/or devices that form information handling system 10. Power supply 62 may be a rechargeable battery, such as a nickel metal hydride ("NiMH") or lithium ion battery, when information handling system 10 is embodied as a portable or notebook computer.

Power supply 62 is preferably coupled to power management microcontroller 64. Power management microcontroller 64 preferably controls the distribution of power from power supply 62. More specifically, power management microcontroller 64 preferably includes power output 66 coupled to main power plane 68 which supplies power to CPU 12. Power management microcontroller 64 may also be coupled to a power plane (not expressly shown) operable to supply power to panel display 36.

Power management microcontroller 64 preferably monitors the charge level of power supply 62 to determine when and when not to charge battery 62. Power management microcontroller 64 is preferably also coupled to main power switch 70, which the user actuates to turn information handling system 10 on and off. While power management microcontroller 64 powers down one or more portions or components of information handling system 10, e.g., CPU 12, panel display 36, or hard drive 54, when not in use to conserve power, power management microcontroller 64 itself is preferably substantially always coupled to a source of power, preferably power supply 62.

In a portable embodiment, information handling system 10 may also include screen lid switch 72 or indicator 72 which provides an indication of when panel display 36 is in an open position and an indication of when panel display 36 is in a closed position. It is noted that panel display 36 may be located in the same location in the lid (not expressly shown) of the computer as is typical for clamshell configurations of portable computers such as laptop or notebook computers. In this manner, panel display screen 36 may form an integral part of the lid of the system, which swings from an open position to permit user interaction to a closed position.

Computer system 10 may also include power management chip set 74. Power management chip set 74 is preferably coupled to CPU 12 via local bus 26 so that power management chip set 74 may receive power management and control commands from CPU 12. Power management chip set 74 is preferably connected to a plurality of individual power planes (not expressly shown) operable to supply power to respective components of information handling system 10, e.g., hard drive 54, floppy drive 56, etc. In this manner, power management chip set 74 preferably acts under the direction of CPU 12 to control the power supplied to the various power planes and components of a system.

Real-time clock (RTC) 76 may also be coupled to I/O controller 52 and power management chip set 74. Inclusion of RTC 76 permits timed events or alarms to be transmitted to power management chip set 74. Real-time clock 76 may be programmed to generate an alarm signal at a predetermined time as well as to perform other operations.

Referring now to FIG. 2, simplified drawing illustrating a portion of an information handling system motherboard or system board connected to a portion of a port replicating device via a port replicator connector is shown, according to teachings of the present disclosure. Express illustration of additional communication pathway components, e.g., DC biasing, transmission line termination and others, have been intentionally omitted to permit the reader to focus on teachings of the present disclosure. As such, FIG. 2 is not intended as a schematic drawing enabling construction of a board-mounted communication pathway, but as a tool for implementing teachings of the present disclosure. Information handling system motherboard or system board 90 may include one or more of the devices discussed above with reference to FIG. 1.

As shown in FIG. 2, information handling system motherboard 90, according to teachings of the present disclosure, preferably includes physical layer transceiver 92, communication switch 94 and communication port 96. Port replicating device 98 is also illustrated in FIG. 2 and may be connected to system board 90 via port replicating connector 100. Among other components, port replicating device 98 preferably includes communication port 102. In one embodiment communication controller 58 is coupled to one or more of physical layer transceiver 92, communication switch 94 and communication port 96 as well as other components or devices.

Physical layer transceiver 92 is preferably coupled to communication switch 94 via a first set or plurality of board-mounted transmission lines, such as transmission lines 104, 106, 108, 110, 112, 114, 116 and 118. Communication switch 94, as illustrated in FIG. 2, is preferably coupled to communication port 96 via a second set or plurality of board-mounted transmission lines, such as transmission lines 120, 122, 124, 126, 128, 130, 132 and 134. Communication switch 94 is also preferably connected to port replicator connector 100 through a third set or plurality of board-mounted transmission lines, such as transmission lines 136, 138, 140, 142, 144, 146, 148 and 150. Transmission lines 136, 138, 140, 142, 144, 146, 148 and 150 may be communicatively coupled to communication port 102 of port replicating device 98 through port replicator connector 100 and transmission lines 152, 154, 156, 158, 160, 162, 164 and 166, respectively.

Preferably included in communication port 96 are a plurality of isolation magnetics designed and included, at least in part, to prevent surges or spikes in power, electricity, etc., on communication network 60 from adversely affecting electronics and electrical characteristics of information handling system 10 and on system board or motherboard 90. As shown in FIG. 2, transmission lines 120 and 122 are preferably coupled to a corresponding pair of conductors or external network communication transmission lines 121 and 123 in communication port 96 via isolation magnetics 168. Similarly, transmission line pairs 124 and 126, 128 and 130, as well as 132 and 134, are also preferably coupled to respective pairs of conductors or transmission lines 125 and 127, 129 and 131, 133 and 135, included in communication port 96, respectively. Transmission line pairs 124 and 126, 128 and 130 as well as 132 and 134 are preferably coupled to their corresponding communication port 96 conductors via isolation magnetics 170, 172 and 174, respectively.

Similar to communication port 96 on system board 90, communication port 102 of port replicator 98 preferably also includes a plurality of isolation magnetics designed and included, at least in part, to minimize or prevent spikes or surges in power on communication network 60 from adversely affecting electronics, preferably included in port replicating device 98. As shown in FIG. 2, transmission line pairs 152 and 154, 156 and 158, 160 and 162, as well as 164 and 166, are preferably coupled to respective pairs of transmission lines, 153 and 155, 157 and 159, 161 and 163 as well as 165 and 167, preferably included in communication port 102 via isolation magnetics 176, 178, 180 and 182, respectively.

Without the inclusion of communication switch 94, the electrical characteristics of the communication pathway between physical layer transceiver 92 and communication port 96 or between physical layer transceiver 92 and communication port 102 may be ascertained generally from electrical characteristics of the various transmission lines connecting each communication port with physical layer transceiver 92 as well as from electrical characteristics of physical layer transceiver 92 itself and either communication port 96 or 102 itself. However, with the inclusion of communication switch 94, ascertaining the electrical characteristics of a communication pathway between physical layer transceiver 92 and communication port 96 or a communication pathway between physical layer transceiver 92 and communication port 102 generally requires taking into consideration electrical characteristics introduced by communication switch 94, transmission lines connecting communication port through communication switch 94 to physical layer transceiver 92 as well as the components of physical layer transceiver 92 and either communication port 96 or communication port 102.

Depending upon the communication protocol implemented on communication network 60, the parameters to which electrical characteristics of a given communication pathway must comply may be more strict than if an alternative communication protocol were chosen. For example, in an ordinary 10-Base-T Ethernet network, the effects on the communication pathway of a given system resulting from the addition of communication switch 94 may often be ignored and still have the communication pathway comply with the standards for such a network, e.g., the 10-Base-T Ethernet standards set by IEEE. As communication speeds go up, however, for example in gigabit Ethernet or IEEE 802.3ab, the parameters to which a communication pathway of information handling system 10 must comply are much more strict. While reference herein is made primarily to impedance matching in a gigabit Ethernet or IEEE 802.3ab environment, teachings of the present disclosure are not limited to impedance matching or IEEE 802.3ab. Instead, teachings of the present disclosure may be implemented with a variety of other present or future communication protocols to achieve varying communication link goals including, but not limited to, impedance matching.

As discussed above, one of the beneficial uses of notebook computers has come to be the ability to employ port replicating devices which enable a user to quickly dock and undock their notebook computer from a variety of peripheral or other devices. In addition to the myriad of devices that may be connected to a notebook computer system, many notebook computers today include a communication port within the notebook computer itself and, in addition, the same notebook computers often include a port replicating connector which enables the notebook computer to be connected to a port replicator or docking station where the port replicator or docking station itself also includes a communication port. It is in such implementations that the introduction of communication switch 94 or a similar device is desired. In operation, communication switch 94 is preferably configured to selectively activate for operation either a communication port on board the notebook computer itself, such as a communication port 96 of FIG. 2, or the communication port incorporated on an attached docking station or port replicator, such as communication port 102 of FIG. 2.

Generally, when the notebook computer is disconnected from the port replicator or docking station, internal electronics of the notebook computer system notify a communication switch included therein that the notebook computer system has been disconnected from the port replicator or docking station which in turn causes the communication switch to activate a notebook computer mounted communication port, such as communication port 96 of FIG. 2. Alternatively, when the notebook computer is docked or connected to a port replicator or docking station, the communication switch, such as communication switch 94, is preferably notified of such connection and will then preferably disable the on-board communication port of the notebook computer and activate, preferably through communication switch 94, a communication port incorporated on the port replicator or docking station, such as communication port 102.

In most implementations of system board or motherboard 90, the various transmission lines between physical layer transceiver 92, communication port 96 and communication switch 94 typically include metal conductors, for example copper, laid substantially parallel or mounted to the board substantially parallel in between the various components, as a given board design may suggest. As a result of such substantially parallel board mounting, various field effects, electrical properties and other characteristics of communication technology may not be accounted for, cancelled or otherwise attended to as typically occurs in twisted pair wire or conductor arrangements employed for similar purposes. Accordingly, in one embodiment, teachings of the present disclosure, in an effort to account for those consequences generally unaccounted for in substantially parallel board-mounted transmission lines, compensate or tune a communication pathway of information handling system 10 by adding one or more inductive devices to one or more of the transmission lines connecting components of a given communication pathway.

As illustrated in FIG. 2, transmission lines 104, 106, 108, 110, 112, 114, 116 and 118, traveling between physical layer transceiver 92 and communication switch 94 each preferably include an inductive device 178, 180, 182, 184, 186, 188, 190 and 192, respectively. In an alternate embodiment, transmission lines 120, 122, 124, 126, 128, 130, 132 and 134 may include one or more inductive devices coupled to each, either in lieu of or in addition to the inductive devices of the first plurality of transmission lines coupling physical layer transceiver 92 and communication switch 94. In still another embodiment, transmission lines 136, 138, 140, 142, 144, 146, 148 and 150 may also include one or more inductive devices coupled thereto, either in lieu of or in addition to inductive devices coupled to the first plurality of transmission lines connecting physical layer transceiver 92 and communication switch 94 or in lieu of or in addition to the second plurality of transmission lines connecting communication switch 94 and communication port 96. In still another embodiment, transmission lines 152, 154, 156, 158, 160, 162, 164 and 166 may include one or more inductive devices coupled thereto either lieu of or in addition to inductive devices coupled to the first plurality of transmission lines, the second plurality of transmission lines or the third plurality of transmission lines, connecting communication switch 94 to port replicator connector 100. Additional arrangements or combinations of inductive devices on the various transmission lines are contemplated within the spirit and scope of the present disclosure.

As illustrated, FIG. 2 shows an embodiment where inductive elements 178, 180, 182, 184, 186, 188, 190 and 192 are shared between ports 96 and 102. In an alternate embodiment, it is contemplated that the various transmission lines of an information handling system may be significantly unique and, therefore, that it may not be effective to compensate the communication pathway from transceiver 92 to communication port 96 using the same or similar inductive elements as may be required by the communication pathway from transceiver 92 to communication port 102. In such an embodiment, or a similar embodiment, one or more inductive elements may be shown to exist on respective transmission lines and the one or more inductive elements may be dissimilar. In addition, inductive elements may be placed between transceiver 92 and communication switch 94 as well as between communication switch 94 and communication ports 96 and 102; in such an embodiment, the sum of inductive elements along a transmission line may be utilized to compensate for a selected communication pathway.

Referring now to FIG. 3, an alternative view of a connection generally illustrated in FIG. 2 between physical layer transceiver 92 and communication switch 94 as well as between communication switch 94 and communication ports 96 and 102, is shown. As depicted in FIG. 3, the addition of communication switch 94 to a communication pathway traveling between either physical layer transceiver 92 and either communication port 96 or communication port 102 typically introduces at least a switch-based resistance 194 and 195 and a switch-based capacitance 196 and 197, see transmission lines 104 and 106 respectively. Actual or precise values of switch-based resistance 194 and 195 or switch-based capacitance 196 and 197 generally depends on a variety of factors. For example, materials used in a communication switch die package, leads used in the communication switch die package, dimensions of various aspects of the communication switch die package, as well as other factors, all have at least some effect on ascertaining values for switch-based resistance 194 and 195 and switch-based capacitance 196 and 197.

As mentioned above, the present disclosure teaches incorporation of an inductive device along one or more board-mounted transmission lines connecting communication port 96 or communication port 102 to physical layer transceiver 92 to compensate or tune selected transmission lines and thereby substantially eliminate adverse effects resulting from the inclusion of communication switch 94. Selection of a preferred inductive device may be achieved or effected by taking and compiling a number of measurements on the component side of communication port 96 or 102 and then choosing an inductive device which adjusts, tunes or compensates the electrical characteristic or characteristics desired to conform to those required by the communication protocol on the network side of communication port 102 or 96. For example, in an effort to tune communication pathway between physical layer transceiver 92 and communication port 96, electrical characteristics of transmission lines 104 and 106, such as material, dimensions, etc., connecting physical layer transceiver 92 to communication switch 94 and transmission lines 120 and 122 connecting communication switch 94 to communication port 96 may be ascertained. In addition, the communication switch 94 selected for inclusion in the communication pathway may have its switch-based resistance 194 and 195, switch-based capacitance 196 and 197, and, optionally, other characteristics, ascertained. Isolation magnetics capacitance 198 and 199 may also be taken into consideration when selecting an inductive device to tune a given communication pathway. Once the values for the electrical components of a selected communication pathway have been generally ascertained, and the parameters required on communication network 60 have been obtained, a desirable, preferred or ideal inductive device 178 and/or 180 selection may be ascertained.

Selection of inductive device 178 and/or 180, or an alternative device or device combination designed to compensate or tune one or more electrical characteristics of a selected communication pathway, may be directed towards cancellation, compensation or tuning of one or more electrical characteristics of a given communication pathway. For example, selection of inductive device 178 and/or 180 may primarily concern compensating or tuning the switch capacitance 196 and/or 197 resulting from the incorporation of communication switch 94. In accordance with teachings of the present disclosure, the form of inductive device included on any given transmission line may be varied. For example, an inductive device may take the form of a coil or toroid as well as be formed from one or more electrical components combined to achieve substantially the same electrical effect. In general, an inductive device may include any current or future inductive device or device combination capable of tuning, compensating or canceling one or more electrical characteristics of a communications pathway.

In one embodiment, the process described above for selection of inductive device 178 and/or 180 may be repeated for each transmission line or transmission line pair desired to be tuned or compensated. In an alternate embodiment, once a desired inductive device has been identified for a selected transmission line, a similar inductive device may simply be coupled to each of the remaining transmission lines selected for tuning or compensation. Other embodiments of selecting a compensating or tuning device for coupling to one or more selected transmission lines may be implemented in accordance with teachings of the present disclosure.

As suggested above, selection and placement of one or more inductive devices on one or more of the plurality of transmission lines included on system board 90 and/or on port replicating device 98, may achieve the desired goal. For example, referring still to FIG. 3, instead of placing inductive device 178 and 180 on transmission lines 104 and 106, respectively, an inductive device may be placed on each of transmission line pairs 120 and 122 as well as 152 and 154 to achieve substantially the same goal of tuning a communication pathway between physical layer transceiver 92 and either of communication ports 96 and 102 to that of an external network 60. By incorporating an inductive device on one or more of the plurality of transmission lines, serially as shown, between communication switch 94 and communication port 96 and/or on the plurality of transmission lines connecting communication switch 94 and communication port 102, regardless of the position of switches 202 and 203, the communication pathway between physical layer transceiver 92 and either of communication port 96 or 102 will preferably be substantially balanced on the component side of communication ports 96 and 102 with the network side of communication ports 96 and 102. Other combinations of placing inductive devices on the various sets of transmission lines between the various components of a given communications pathway as well as portions of the plurality of transmission lines between the components of a given communications pathway are contemplated within the scope of the present disclosure.

Although the disclosed embodiments have been described in detail, it should be understood that various changes, substitutions and alterations can be made to the embodiments without departing from their spirit and scope.

What is claimed is:

1. An information handling system, comprising:
   at least one processor;
   at least one memory operably associated with the processor;
   a physical layer transceiver operably associated with the memory and the processor;
   a communication switch operably coupled to the physical layer transceiver via a first set of board-mounted transmission lines;
   a communication port operably coupled to the communication switch via a second set of board-mounted transmission lines, the communication port operable to communicatively couple to an external network connection;
   a port replicator connector operably coupled to the communication switch via a third set of board-mounted transmission lines, the port replicator connector operable to communicatively couple the information handling system to an external network connection via a port replicator mounted communication port; and
   a plurality of inductive devices operably coupled to a plurality of board-mounted transmission lines, the inductive devices selected and coupled to the board-mounted transmission lines to offset at least one electrical characteristic of the communication switch such that one or more electrical characteristics of selected board-mounted transmission lines may be tuned to substantially approximate one or more electrical characteristics required by a communication protocol on the external network.

2. The information handling system of claim 1, further comprising positioning the inductive devices on a plurality of the board-mounted transmission lines between the communication switch and the physical layer transceiver.

3. The information handling system of claim 2, further comprising positioning the inductive devices on two pairs of board-mounted transmission lines, the first pair of board-mounted transmission lines for use in receiving information from the external network and the second pair of board-mounted transmission lines for use in transmitting information to the external network.

4. The information handling system of claim 2, further comprising positioning the inductive devices on four pairs of board-mounted transmission lines, each of the pairs of board-mounted transmission lines operable to receive information from and transmit information to the external network.

5. The information handling system of claim 1, further comprising positioning the inductive devices on a plurality of the board-mounted transmission lines between the communication switch and the communication port and on a plurality of the board-mounted transmission lines between the communication switch and the port replicator connector.

6. The information handling system of claim 1, further comprising;
   a port replicator operably coupled to the port replicator connector, the port replicator including an information handling system connector, a communication port and a plurality of board-mounted transmission lines operably coupling the information handling system connector to the communication port;
   a plurality of inductive devices coupled to the second set of board-mounted transmission lines; and
   a plurality of inductive devices coupled to the board-mounted transmission lines of the port replicator.

7. The information handling system of claim 6, further comprising the port replicator operable to receive and operate at least one add-on device.

8. The information handling system of claim 1, further comprising the inductive devices selected and positioned such that a communication signal produced at the communication port complies with transmission line specifications as embodied in the example of IEEE 802.3ab.

9. A circuit board for use in an information handling system, comprising:
   at least one Ethernet physical layer transceiver;
   at least one Ethernet switch communicatively coupled to the Ethernet physical layer transceiver through a first plurality of board-mounted transmission lines;
   at least one Ethernet communication port communicatively coupled to the Ethernet switch through a second plurality of board-mounted transmission lines;
   a port replicating device connector communicatively coupled to the Ethernet switch through a third plurality of board-mounted transmission lines;
   a plurality of inductive devices serially coupled to a plurality of the board-mounted transmission lines, the inductive devices selected and positioned to offset an electrical characteristic of the Ethernet switch such that an impedance measure from the Ethernet physical layer transceiver to an external Ethernet network connection on the circuit board substantially matches an impedance measure required by a communication protocol on the external Ethernet network.

10. The circuit board of claim 9, further comprising of the plurality of inductive devices coupled to the first plurality of board-mounted transmission lines.

11. The circuit board of claim 10, further comprising an inductive device coupled to each of the first plurality of board-mounted transmission lines.

12. The circuit board of claim 9, further comprising the plurality of inductive devices operably coupled to the second and third pluralities of board-mounted transmission lines.

13. The circuit board of claim 9, further comprising:
   inductive devices coupled to the second plurality of board-mounted transmission lines; and
   the third plurality of board-mounted transmission lines operable to couple to a port replicator having inductive devices coupled to corresponding board-mounted transmission lines included therein.

14. The circuit board of claim 9, further comprising the plurality of inductive devices coupled to at least two of the pluralities of board-mounted transmission lines.

15. The circuit board of claim 9, further comprising:
   a gigabit Ethernet switch;
   an inductive device operably coupled to each of the first plurality of board-mounted transmission lines; and the inductive devices selected to substantially offset capacitive characteristics of the gigabit Ethernet switch.

16. An information handling system communication pathway, comprising:

a physical layer transceiver;

an electronic switch operably coupled to the physical layer transceiver through four pairs of board-mounted transmission lines;

a communication port coupled to the electronic switch through four pairs of board-mounted transmission lines;

a port replicator connection operably coupled to the electronic switch through four pairs of board-mounted transmission lines;

the electronic switch operable to selectively activate communications capabilities on the communication port and the port replicator connection; and at least one of the four pairs of board-mounted transmission lines having included on each board-mounted transmission line an inductive device serially coupled thereto, selection and placement of the inductive devices to offset an electrical characteristic of the electronic switch such that substantial impedance matching is achieved with a communication protocol on a communication network to be connected to the information handling system.

17. The information handling system communication pathway of claim 16, further comprising:

the inductive devices coupled between the electronic switch and the physical layer transceiver; and the inductive devices selected and placed to substantially offset an electronic switch capacitance such that a communication signal produced on the communication pathway complies with transmission line specifications as embodied in IEEE 802.3ab.

* * * * *